(12) United States Patent
Vangala

(10) Patent No.: US 7,928,816 B2
(45) Date of Patent: Apr. 19, 2011

(54) DELAY FILTER MODULE

(75) Inventor: Reddy R. Vangala, Albuquerque, NM (US)

(73) Assignee: CTS Corporation, Elkhart, IN (US)

( * ) Notice: Subject to any disclaimer, the term of this patent is extended or adjusted under 35 U.S.C. 154(b) by 316 days.

(21) Appl. No.: 12/069,763

(22) Filed: Feb. 13, 2008

(65) Prior Publication Data

US 2008/0204165 A1    Aug. 28, 2008

Related U.S. Application Data

(60) Provisional application No. 60/902,796, filed on Feb. 22, 2007.

(51) Int. Cl.
*H01P 9/00* (2006.01)
*H01P 1/201* (2006.01)

(52) U.S. Cl. .......................................... 333/156; 333/202

(58) Field of Classification Search .................. 333/109, 333/110, 112, 115, 117, 118, 138–140, 167, 333/168, 174, 175, 185, 205, 202, 156
See application file for complete search history.

(56) References Cited

U.S. PATENT DOCUMENTS

| 3,277,403 | A | 10/1966 | Cohn |
| 4,692,726 | A | 9/1987 | Green et al. |
| 4,800,348 | A | 1/1989 | Rosar et al. |
| 5,864,265 | A | 1/1999 | Ballance et al. |
| 6,317,013 | B1 | 11/2001 | Hershtig |

FOREIGN PATENT DOCUMENTS

| WO | WO 92/20163 | 11/1992 |
| WO | WO 2006/058964 | 6/2006 |
| WO | WO 2006/095551 | 9/2006 |

OTHER PUBLICATIONS

Pastor Jiminez, J., PCT International Search Report mailed Jun. 11, 2008 re: International Application No. PCT/US2008/002059 filed Feb. 15, 2008.
Pastor Jiminez, J., PCT Written Opinion of the International Searching Authority mailed Jun. 11, 2008 re: International Application No. PCT/US2008/002059 filed Feb. 15, 2008.

*Primary Examiner* — Benny Lee
*Assistant Examiner* — Gerald Stevens
(74) *Attorney, Agent, or Firm* — Daniel J. Deneufbourg

(57) ABSTRACT

A delay filter module comprising at least one dielectric boneblack ceramic band pass filter and a circuit for compensating/equalizing the signal delay produced by the delay filter. In one embodiment, the circuit is defined by a hybrid coupler defining at least two ports coupled to a dielectric ceramic reactive termination block defining at least a pair of reactive termination resonators and coupling capacitors. The delay can be adjusted by tuning the dielectric boneblack band pass filter and/or the reactive termination resonators and/or the coupling capacitors defined by the dielectric ceramic reactive termination block.

4 Claims, 3 Drawing Sheets

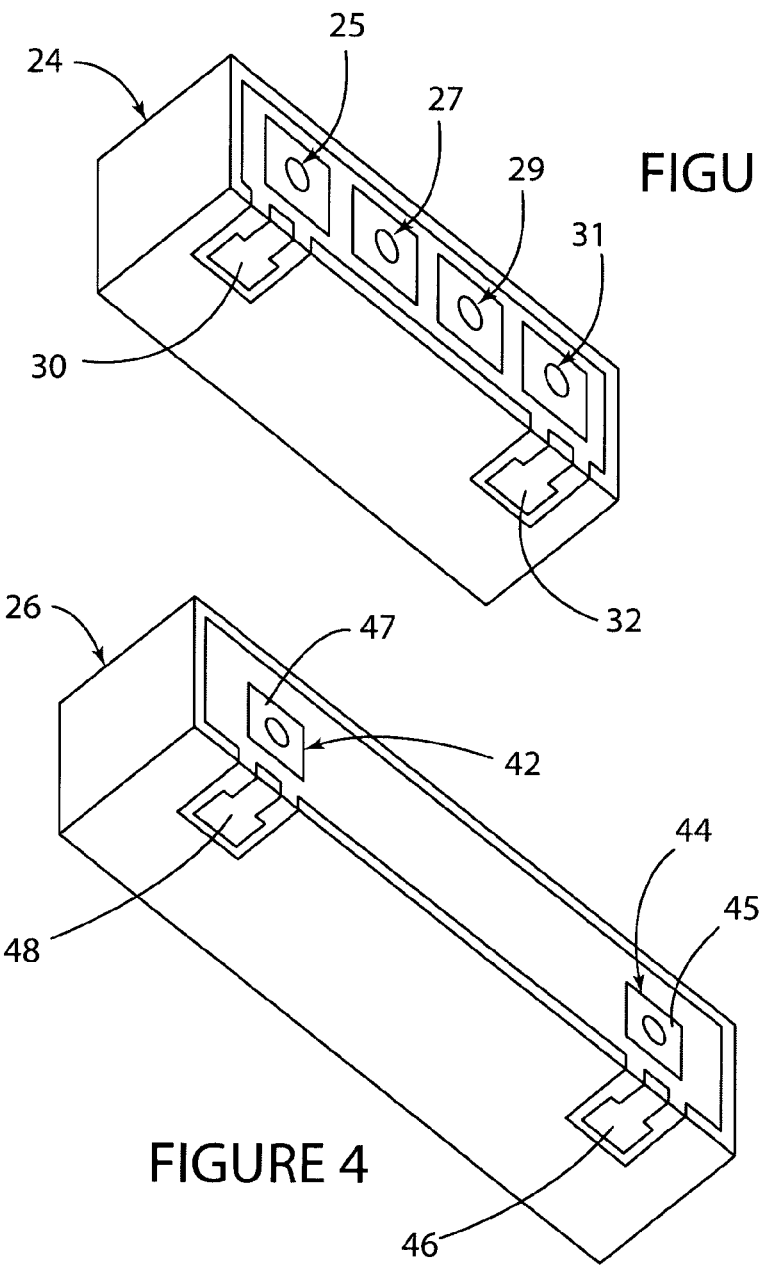

US 7,928,816 B2

DELAY FILTER MODULE

CROSS-REFERENCE TO RELATED APPLICATION

This application claims the benefit of the filing date of U.S. Provisional Patent Application Ser. No. 60/902,796, filed on Feb. 22, 2007, which is explicitly incorporated herein by reference as are all references cited therein.

FIELD OF THE INVENTION

The present invention is directed to a module and method for filtering and/or delaying the transmission of RF signals through a delay filter and, more particularly, to a module comprising a dielectric boneblack delay filter and a dielectric reactance boneblack.

BACKGROUND OF THE INVENTION

An important component of any system designed to produce and pass RF signals such as, for example, cellular phones and other wireless communication equipment systems, is the power amplifier which amplifies the signals associated with the system. These amplifiers typically include one or more delay elements which, preferably have a uniform, temperature stable, and fixed amount of insertion delay and linear phase over a predetermined frequency range.

A "feedforward correction" scheme has to date been used to linearize power amplifiers. It employs two loops, the main amplifier-carrier cancellation loop and the error amplifier-intermodulation cancellation loop. The delay of the amplifiers in both loops needs to be well matched to achieve cancellation over a broad bandwidth.

Delay modules most commonly incorporate filters for filtering and delaying the RF signal passing therethrough and circuits associated therewith for equalizing the delay across the passband of the filter.

The circuits for equalizing the delay across the passband of the filter most commonly have incorporated couplers and discrete, lumped resonator L-C components of the type disclosed in, for example, U.S. Pat. No. 3,277,405 to Cohn and U.S. Pat. No. 6,317,013 to Hershtig.

SUMMARY OF THE INVENTION

The present invention relates to a delay filter module incorporating a band pass filter and a reactance block, both preferably of dielectric boneblack ceramic construction.

More specifically, the delay filter module initially comprises a printed circuit board defining a plurality of RF signal pathways including at least respective RF signal input and output pathways/transmission lines.

In accordance with one embodiment of the present invention, a dielectric boneblack delay band pass filter is mounted on the printed circuit board and is adapted to provide and pass a delayed and filtered RF signal through the module. The filter preferably defines at least two resonators and at least two RF signal input/output ports.

The module of the present invention additionally comprises a delay equalization circuit for compensating, equalizing, and "flattening" the delay in the delay filter. The circuit initially includes a hybrid coupler which is also mounted to the printed circuit board and defines at least four RF signal input/output ports. The circuit further includes at least two dielectric resonators which are mounted to the printed circuit board and coupled respectively to two of the coupler ports. The resonators define the capacitors of the delay equalization circuit.

The other two of the coupler ports are coupled respectively to one of the ports of the dielectric boneblack delay filter and one of the RF signal input/output lines defined on the printed circuit board. The other of the RF signal input/output lines defined on the printed circuit board is coupled to the other of the RF signal input/output ports defined on the dielectric boneblack delay band pass filter.

In a preferred embodiment, the module comprises a dielectric boneblack reactance element which is mounted on the printed circuit board and defines the two dielectric resonators of the circuit for compensating the delay in the delay filter.

A method for adjusting the ripple (i.e., variation) in the delay produced by the delay band pass filter includes the steps of tuning the delay filter and/or the resonators of the reactance filter and/or the capacitors using known techniques for tuning dielectric boneblack filters.

There are other advantages and features that will be more readily apparent from the following description of the invention, the drawings, and the appended exemplary claims.

BRIEF DESCRIPTION OF THE DRAWINGS

In the accompanying drawings that form part of the specification, and in which like numerals are employed to designate like parts throughout the same:

FIG. 3 is a perspective view of the dielectric boneblack ceramic band pass filter of the module of the present invention;

FIG. 4 is a perspective view of the dielectric ceramic reactive termination block of the module of the present invention.

DETAILED DESCRIPTION OF THE PREFERRED EMBODIMENT

Figure 1:
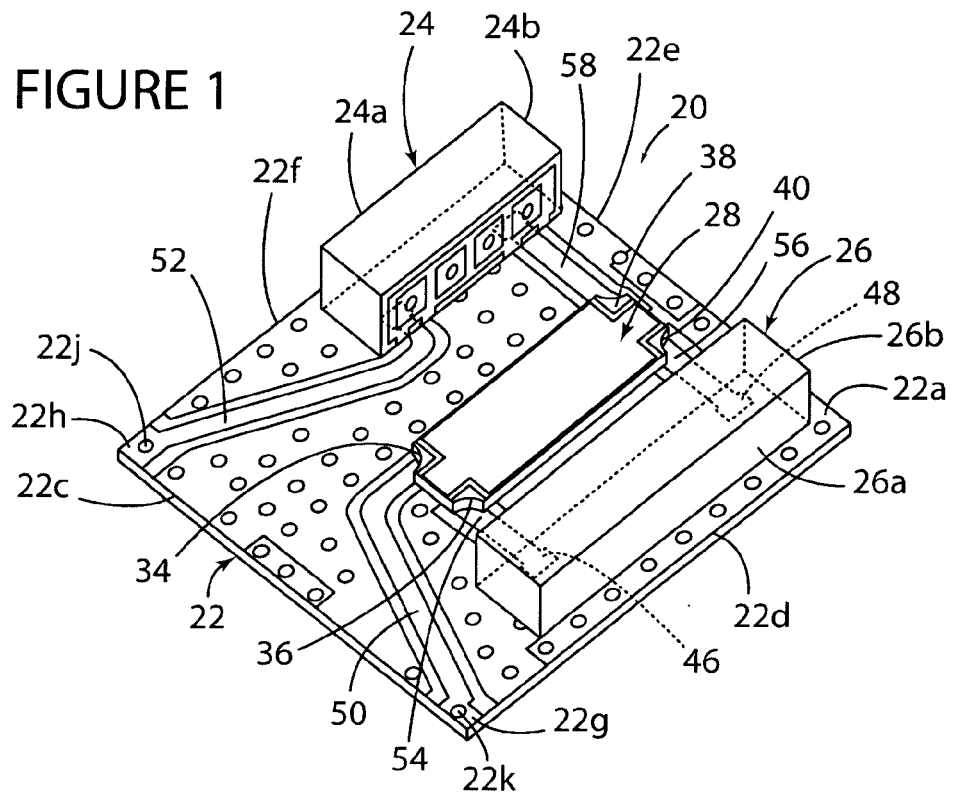
FIG. 1 is a perspective view of the top surface of a delay filter module constructed in accordance with the present invention without a lid thereon.

FIG. 1 depicts a UMTS WCDMA delay filter module 20, constructed in accordance with the present invention which is designed for providing a defined/equalized RF signal delay over a specified bandwidth, as well as provide a filter response.

The platform for module 20 has a modular SMT passive construction which allows for a standard, high reliability, footprint for various frequencies and delays. The use of a standard footprint, of course, allows ease of customer layout. In accordance with the present invention as described in more detail below, the manufacture of module 20 on a standard footprint allows different sizes of boneblack band pass filters 24, or filters 24 with different numbers of resonators, to be used for different frequencies or nominal delay values.

Figure 2:
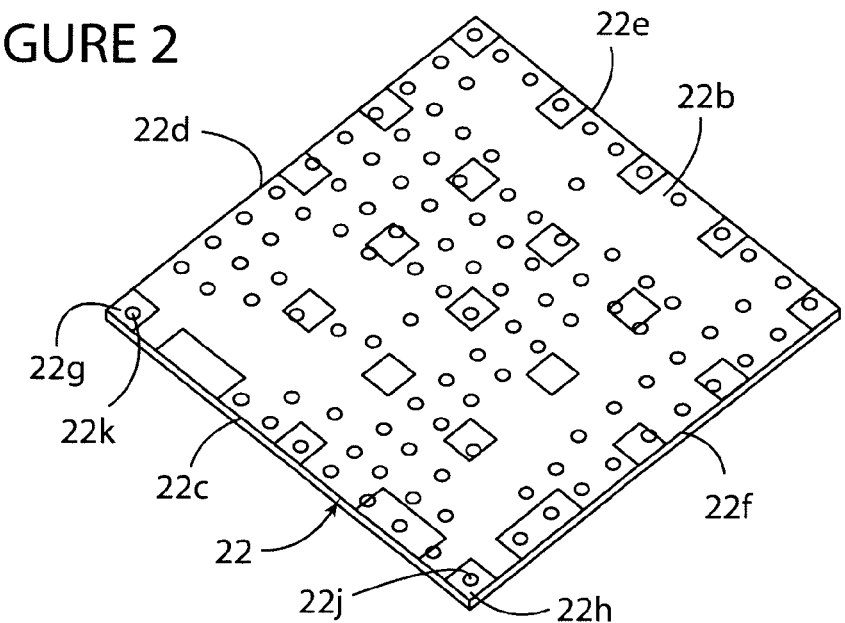
FIG. 2 is a perspective view of the bottom surface of the delay filter module of FIG. 1.

In the embodiment as shown in FIGS. 1 and 2, module 20 initially comprises a printed circuit board 22 of standard construction which: defines at least top/upper and bottom/lower surfaces or faces 22*a* and 22*b*; defines peripheral elongate sides or edges 22*c*, 22*d*, 22*e*, and 22*f*; is preferably 1"×1" (25.4 mm square) in size; and preferably has the following elements suitably mounted/secured to the top surface/face 22*a* thereof: a dielectric boneblack band pass ceramic delay filter 24 adapted to provide and pass a delayed and filtered RF signal through the module 20; a dielectric ceramic reactive termination block 26; and a 3 dB hybrid coupler 28.

Figure 5:
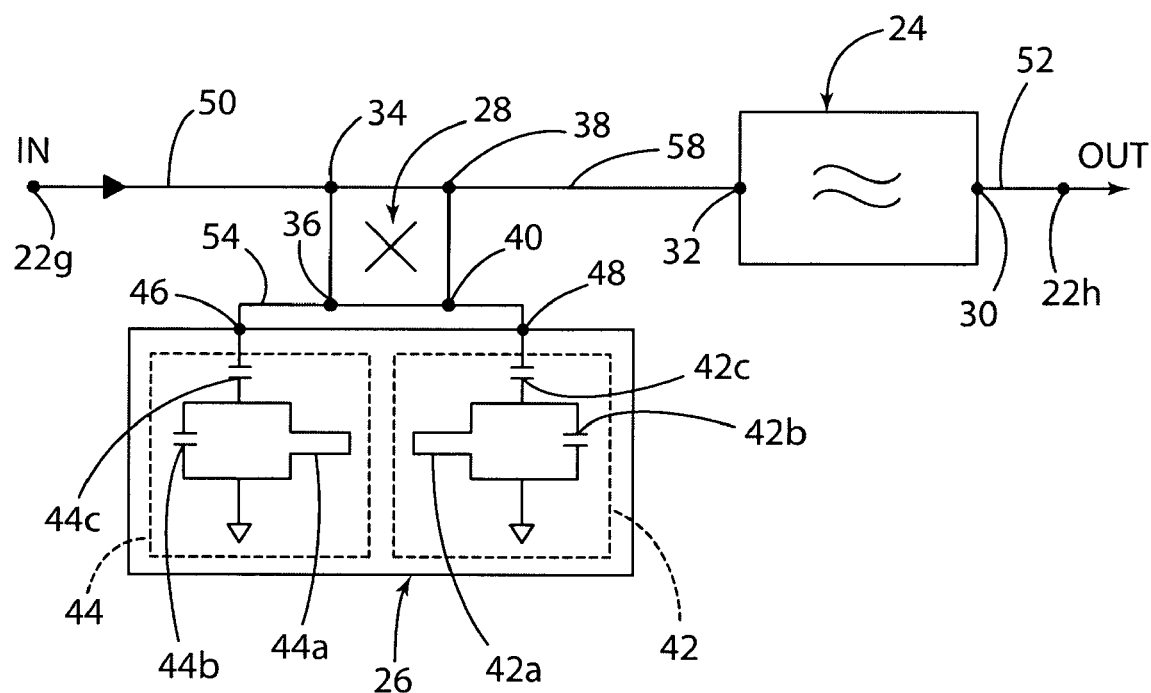
FIG. 5 is a simplified schematic of the electrical circuit of the delay filter module of the present invention.

Band pass filter 24, as shown in FIGS. 1, 3 and 5, is surface mountable and preferably of a dielectric boneblack ceramic construction disclosed in, for example, U.S. Pat. No. 4,692,726 to Green, the description of which is incorporated herein by reference, and includes a plurality of through-holes defining a plurality of respective resonators 25, 27, 29 and 31; an RF signal output pad/port 30; and an RF signal input pad/port 32 (FIG. 3). In the embodiment shown, filter 24 is located in the top left hand corner of the board 22 in a relationship wherein the outer long side edge 24a of filter 24 is positioned adjacent and parallel to board side edge 22f and the filter outer short side edge 24b is positioned adjacent and parallel to board top edge 22e. Pads 30 and 32 are defined on the side face of the filter 24 adapted to be seated on the top surface 22a of board 22.

Hybrid coupler 28 (FIGS. 1 and 5) is preferably a surface mountable 3 dB quadrature hybrid coupler of the type commonly available from Florida RF Labs of Stuart, Fla. and defining at least four RF signal input/output pads/ports 34, 36, 38 and 40 (FIG. 1). In the embodiment shown, coupler 28 is generally centrally located on the top surface 22a of board 22 between and in a relationship and orientation spaced from and parallel to filter 24, reactive termination block 26, and the edges 22d and 22f of board 22. In the embodiment shown, coupler 28 is located between the filter 24 and the termination block 26. Ports 34, 36, 38, and 40 are defined on the lower face of the coupler 28 adapted to be seated on the top surface 22a of board 22.

Reactance block 26 (FIGS. 1, 4, and 5) is also preferably of dielectric boneblack ceramic construction similar to that disclosed in U.S. Pat. No. 4,692,726 to Green and thus includes at least a pair of through-holes defining respective L-C resonators 42 and 44; respective RF signal input/output pads/ports 46 and 48; and pads 45 and 47 surrounding the through-holes defining respective resonators 42 and 44 which, in combination with the respective pads 46 and 48 and the spaces defined therebetween on the top surface of the filter 26, define respective capacitors as shown in more detail in FIG. 5. Pads 46 and 48 are defined on the side face of filter 26 adapted to be seated against the top surface 22a of board 22.

As shown in FIG. 5, the resonator 44 of filter 26 defines a reactance termination circuit including a transmission line 44a which is less than a quarter wave length and is short-circuited at one end and respective shunt and coupling capacitors 44b and 44c. In a like manner, the resonator 42 of filter 26 defines a reactance termination circuit including a transmission line 42a which is less than a quarter wave length and is short-circuited at one end, and respective shunt and coupling capacitors 42b and 42c.

It is understood that the resonators 42 and 44 of filter 26 are separated by ground or large enough spacing and thus are not electrically connected. Moreover, and although not shown, it is understood that the block 26 may alternatively comprise two separate blocks defining two separate respective resonators 42 and 44 and ports/pads 46 and 48.

In the embodiment shown, reactive termination block 26 is located, seated, and mounted at the upper right hand corner of the top surface 22a of board 22 in an orientation wherein filter outer long side edge or face 26a extends in a relationship adjacent and parallel to board side edge 22d and filter top short side edge or face 26b extends in a relationship adjacent and parallel to board top edge 22e.

Printed circuit board 22 additionally defines a plurality of RF signal pathways/transmission lines including at least respective RF signal input/output pathways/transmission lines 50 and 52 defined by respective lines of conductive material which have been formed on the top surface 22a of the board 22 (FIGS. 1 and 5).

In accordance with the present invention, and as shown in FIGS. 1 and 5, RF signal pathway 50 terminates in a pad (not shown) defined on the surface 22a of board 22 which electrically couples the pathway 50 to the RF signal input port/pad 34 of hybrid coupler 28. In the embodiment shown, transmission line 50 extends in a generally angular orientation relative to board side edges 22c and 22d between the lower right hand corner of board 22, wherein an input/output pad 22g of conductive material is defined, and coupler input port 34. RF signal port/pad 36 of coupler 28 is electrically coupled to the signal port/pad 46 (FIGS. 1 and 5) of reactive termination block 26 via an RF signal pathway/transmission line 54 defined and formed on the top surface 22a of printed circuit board 22. RF signal port/pad 40 of coupler 28 is electrically coupled to the signal port/pad 48 (FIGS. 1 and 5) of reactive termination block 26 via an RF signal pathway/ transmission line 56 defined and formed on the top surface 22a of printed circuit board 22. In the embodiment shown, coupler ports 34 and 36 are located at the opposed lower corners of coupler 28 while coupler ports 38 and 40 are located at the opposed upper corners of coupler 28.

Further, signal port/pad 38 on coupler 28 is electrically coupled to the signal port/pad 32 (FIG. 3) of monoblock ceramic bandpass filter 24 via an RF signal pathway/transmission line 58 (FIGS. 1 and 5) defined and formed on the top surface 22a of printed circuit board 22.

In the embodiment shown, RF signal transmission lines 54, 56, and 58 are formed on board 22 in an orientation generally normal to the filters 24 and 26 and coupler 28. Transmission lines 56 and 58 are located in a generally co-linear relationship.

Port/pad 30 (FIG. 3) on bandpass filter 24 is electrically coupled to the RF signal pathway/transmission line 52 defined on printed circuit board 22. In the embodiment shown, transmission line 52 extends between filter pad 30 and the lower left hand corner of the board 22 in a generally angular orientation relative to board side edges 22c and 22f, wherein an input/output pad 22h of conductive material is defined and formed.

Although the RF signal transmission lines 50 and 52 are shown in FIGS. 1 and 5 as comprising the RF signal input and output paths respectively, it is understood that the invention encompasses the embodiment where the transmission lines 50 and 52 comprise the RF signal output and input transmission lines respectively.

Moreover, and although not described or shown in any detail, it is understood that each of the transmission lines formed on the top surface 22a of board 22 terminate in contact pads adapted for electrical contact with the corresponding pads of the filter 24, termination block 26, and coupler 28.

Coupler 28 and dielectric ceramic reactive termination block 26 in combination define a delay equalization circuit adapted to compensate/equalize/flatten the delay across the passband of the monoblock ceramic bandpass filter 24.

It is further understood that module 20 is adapted for direct surface mounting to a customer's board in a relationship wherein the lower surface 22b of board 22 is seated over the top surface of the customer's motherboard with the respective input/output pads on the customer's board in contact with the respective RF signal input/output conductive pads 22h and 22g defined at the lower corners of board 22. It is understood that the interior of the through-holes 22j and 22k defined in the respective lower corners of board 22 are coated with conductive material and define respective lines for the transmission of the RF signals between the lower and upper surfaces of the board 22.

A delay line filter module 20 constructed in accordance with the present invention will preferably exhibit the following low IL (Insertion Loss) ripple, low IL dB/nS performance characteristics:

Bandwidth (BW)=2110–2170 MHz
   Att=–17 dB @ 2030 MHz
   Att=–20 dB @ 2240 MHz
   Insertion Loss (IL)=2.5 dB
   IL ripple=±0.2 dB
   Delay=10.15 nS
   Delay range=10 nS to 17 nS
   Delay ripple=±0.15 nS
   Phase linearity=±1°
   Return loss (RL)=14 dB minimum In accordance with the present invention, the ripple (or variation) in the delay time produced by the filter 24 can be adjusted by: 1) tuning the monoblock ceramic band pass filter 24 to a desired passband width; 2) tuning the center frequency of one or both of the resonators 42 and 44 defined by dielectric ceramic reactive termination block 26; and 3) tuning the capacitors, defined on dielectric ceramic reactive termination block 26, which connect the respective resonators 42 and 44 to the ports 40 and 36 respectively of hybrid coupler 28.

The presence/availability of these various tuning points or options of course thus defines a module whose performance characteristics can be easily modified to meet a specific customer specification. For example, module 20 allows nominal delay to be adjusted +/–1 nS simply by changing the BAN of filter 24 by tuning the filter 24 during manufacture. The ability to adjust delay in this manner allows a better match to the delay needed in a power amplifier.

Tuning, of course, can be accomplished by any one or more of the several known methods for tuning dielectric ceramic monoblock filters including, but not limited to, the "backtuning" method described in, for example, U.S. Pat. No. 4,800,348 to Rosar.

Numerous variations and modifications of the embodiment described above may be effected without departing from the spirit and scope of the novel features of the invention. No limitations with respect to the specific module illustrated herein are intended or should be inferred.

I claim:

1. A delay filter module comprising:
   a printed circuit board defining at least respective RF signal input/output transmission lines;
   a dielectric monoblock bandpass filter mounted on the printed circuit board and adapted to provide and pass a delayed and filtered RF signal through the delay filter module, the dielectric monoblock bandpass filter defining at least two resonators and at least two RF signal input/output ports;
   a circuit for compensating the delay in the RF signal passing through the dielectric boneblack band pass filter, the circuit including:
      a hybrid coupler mounted on the printed circuit board and defining at least four RF signal input/output ports; and
      a dielectric reactive termination monoblock including at least two dielectric reactive termination resonators being spaced from each other a distance greater than the width of the dielectric reactive termination monoblock, the at least two dielectric reactive termination resonators located on the printed circuit board, the at least two dielectric reactive termination resonators coupled respectively to two of the at least four RF signal input/output ports defined on said coupler and including at least two coupling capacitors;
      wherein the other two of the at least four RF signal input/output ports on said coupler are respectively coupled to one of the at least two RF signal input/output ports of said dielectric monoblock filter and one of said RF signal input/output transmission lines defined on said printed circuit board, the other of said RF signal input/output transmission lines defined on said printed circuit board being coupled to the other of said RF signal input/output ports defined on said dielectric monoblock band pass filter.

2. The delay filter module of claim 1 wherein the dielectric boneblack band pass filter and the dielectric reactive termination monoblock are both composed of a ceramic material.

3. A delay line filter module comprising:
   a printed circuit board defining an RF signal input transmission line and an RF signal output transmission line;
   a dielectric monoblock bandpass filter of ceramic construction mounted on the printed circuit board and adapted to pass a delayed and filtered RF signal through the delay line filter module, one of said RF signal input or output transmission lines being coupled to said dielectric monoblock bandpass filter;
   a coupler mounted on the printed circuit board, the other of said RF signal input or output transmission lines being coupled to said coupler;
   a dielectric reactive termination monoblock of ceramic construction mounted on the printed circuit board and including only two resonator through-holes spaced from each other a distance greater than the width of the dielectric reactive termination monoblock; and
   a plurality of additional RF signal transmission lines defined on said printed circuit board, the plurality of additional RF signal transmission lines interconnecting said coupler to said dielectric reactive termination monoblock and said coupler to said dielectric monoblock band pass filter and defining a circuit for compensating the delay in the RF signal passing through said dielectric monoblock bandpass filter.

4. The delay line filter module of claim 3 wherein the dielectric boneblack band pass filter, the coupler, and the dielectric reactive termination boneblack are mounted on the printed circuit board in a generally parallel and spaced-apart relationship, the coupler being located on the printed circuit board between the dielectric boneblack band pass filter and the dielectric reactive termination monoblock and first and second RF signal transmission lines of the plurality of additional RF signal transmission lines extend between the coupler and the dielectric reactive termination block and a third RF signal transmission line of the plurality of additional RF signal transmission lines extends between the coupler and the dielectric monoblock bandpass filter.

* * * * *

UNITED STATES PATENT AND TRADEMARK OFFICE
CERTIFICATE OF CORRECTION

| | | |
|---|---|---|
| PATENT NO. | : 7,928,816 B2 | Page 1 of 1 |
| APPLICATION NO. | : 12/069763 | |
| DATED | : April 19, 2011 | |
| INVENTOR(S) | : Reddy R. Vangala | |

It is certified that error appears in the above-identified patent and that said Letters Patent is hereby corrected as shown below:

Title Page, item (57):
Abstract, lines 1-2, "boneblack" should be changed to --monoblock--; line 8, "boneblack" should be changed to --monoblock--.

Column 1, line 16, "boneblack" should be changed to --monoblock--; line 17, "boneblack" should be changed to --monoblock--; line 50, "boneblack" should be changed to --monoblock--; line 56, "boneblack" should be changed to --monoblock--.

Column 2, line 5, "boneblack" should be changed to --monoblock--; line 10, "boneblack" should be changed to --monoblock--; line 12, "boneblack" should be changed to --monoblock--; line 19, "boneblack" should be changed to --monoblock--; line 34, "boneblack" should be changed to --monoblock--; line 57, "boneblack" should be changed to --monoblock--; line 67, "boneblack" should be changed to --monoblock--.

Column 3, line 5, "boneblack" should be changed to --monoblock--; line 33, "boneblack" should be changed to --monoblock--.

Column 5, line 31, "BAN" should be changed to --B/W--; line 57, "boneblack" should be changed to --monoblock--.

Column 6, line 21, "boneblack" should be changed to --monoblock--; line 49, "boneblack" should be changed to --monoblock--; line 50, "boneblack" should be changed to --monoblock--; line 53, "boneblack" should be changed to --monoblock--.

Signed and Sealed this
Twentieth Day of March, 2012

David J. Kappos
*Director of the United States Patent and Trademark Office*